(12) United States Patent
Sung

(10) Patent No.: US 8,236,594 B2
(45) Date of Patent: Aug. 7, 2012

(54) SEMICONDUCTOR-ON-DIAMOND DEVICES AND ASSOCIATED METHODS

(76) Inventor: Chien-Min Sung, Taipei County (TW)

( * ) Notice: Subject to any disclaimer, the term of this patent is extended or adjusted under 35 U.S.C. 154(b) by 664 days.

(21) Appl. No.: 11/584,258

(22) Filed: Oct. 20, 2006

(65) Prior Publication Data

US 2008/0096309 A1  Apr. 24, 2008

(51) Int. Cl.
*H01L 21/20* (2006.01)

(52) U.S. Cl. ........... 438/47; 438/22; 438/46; 438/105; 257/E21.499; 257/E21.502; 257/E21.503

(58) Field of Classification Search ............ 438/105, 438/22, 46, 47; 257/E21.499, 502, 503
See application file for complete search history.

(56) References Cited

U.S. PATENT DOCUMENTS

| | | | |
|---|---|---|---|
| 5,131,963 A * | 7/1992 | Ravi | 148/33.3 |
| 5,376,579 A | 12/1994 | Annamalai | |
| 5,422,901 A | 6/1995 | Lebby et al. | |
| 6,222,299 B1 | 4/2001 | Graebner et al. | |
| 6,770,966 B2 | 8/2004 | Chrysler et al. | |
| 6,794,276 B2 | 9/2004 | Letertre et al. | |
| 6,831,300 B2 | 12/2004 | Doi et al. | |
| 2005/0082564 A1 * | 4/2005 | Kitaoka et al. | 257/103 |
| 2006/0174823 A1 | 8/2006 | Sung | |
| 2006/0186556 A1 | 8/2006 | Sung | |
| 2007/0001181 A1 | 1/2007 | Chen | |

FOREIGN PATENT DOCUMENTS

JP  360128625 A  7/1985

OTHER PUBLICATIONS

PCT Application PCT/US07/22363; filed Oct. 19, 2007; Chien-Min Sung; International Search Report mailed Jun. 5, 2008.

* cited by examiner

*Primary Examiner* — Minchul Yang
(74) *Attorney, Agent, or Firm* — Thorpe North & Western LLP

(57) ABSTRACT

Semiconductor-on-diamond devices and methods for making such devices are provided. One such method may include depositing a semiconductor layer on a semiconductor substrate, depositing an adynamic diamond layer on the semiconductor layer opposite the semiconductor substrate, and coupling a support substrate to the adynamic diamond layer opposite the semiconductor layer to support the adynamic layer.

12 Claims, 2 Drawing Sheets

SEMICONDUCTOR-ON-DIAMOND DEVICES AND ASSOCIATED METHODS

FIELD OF THE INVENTION

The present invention relates generally to methods and associated devices having semiconductor-on-diamond layers. Accordingly, the present invention involves the electrical and material science fields.

BACKGROUND OF THE INVENTION

In many developed countries, major portions of the populations consider electronic devices to be integral to their lives. Such increasing use and dependence has generated a demand for electronics devices that are smaller and faster. As electronic circuitry increases in speed and decreases in size, cooling of such devices becomes problematic.

Electronic devices generally contain printed circuit boards having integrally connected electronic components that allow the overall functionality of the device. These electronic components, such as processors, transistors, resistors, capacitors, light-emitting diodes (LEDs), etc., generate significant amounts of heat. As it builds, heat can cause various thermal problems associated with such electronic components. Significant amounts of heat can affect the reliability of an electronic device, or even cause it to fail by, for example, causing burn out or shorting both within the electronic components themselves and across the surface of the printed circuit board. Thus, the buildup of heat can ultimately affect the functional life of the electronic device. This is particularly problematic for electronic components with high power and high current demands, as well as for the printed circuit boards that support them.

Various cooling devices have been employed such as fans, heat sinks, Peltier and liquid cooling devices, etc., as means of reducing heat buildup in electronic devices. As increased speed and power consumption cause increasing heat buildup, such cooling devices generally must increase in size to be effective and may also require power to operate. For example, fans must be increased in size and speed to increase airflow, and heat sinks must be increased in size to increase heat capacity and surface area. The demand for smaller electronic devices, however, not only precludes increasing the size of such cooling devices, but may also require a significant size decrease.

As a result, methods and associated devices are being sought to provide adequate cooling of electronic devices while minimizing size and power constraints placed on such devices due to cooling.

SUMMARY OF THE INVENTION

Accordingly, the present invention provides semiconductor-on-diamond devices having improved thermal properties and methods for making such devices. In one aspect, for example, a method of making a semiconductor-on-diamond device is provided. Such a method may include depositing a semiconductor layer on a semiconductor substrate, depositing an adynamic diamond layer on the semiconductor layer opposite the semiconductor substrate, and coupling a support substrate to the adynamic diamond layer opposite the semiconductor layer to support the adynamic layer.

Numerous materials may be utilized as semiconductor substrates upon which the semiconductor layer is deposited. Examples of such semiconductor substrates may include, without limitation, silicon, silicon carbide, silicon germanium, sapphire, aluminum arsenide, aluminum phosphide, gallium arsenide, gallium phosphide, gallium nitride, and combinations thereof. In one specific aspect, the semiconductor substrate may include sapphire. In another specific aspect, the semiconductor substrate may include silicon. Additionally, various semiconductor materials are contemplated to utilization as a semiconductor layer. The selection of particular semiconductor materials may depend on the type of semiconductor device and the intended use of the device. Specific semiconductor layer materials may include, however, silicon, silicon carbide, silicon germanium, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, and combinations thereof. In one specific aspect, the semiconductor layer may be gallium nitride. In another specific aspect, the semiconductor layer may be aluminum nitride. In some aspects it is also contemplated that multiple semiconductor layers may be deposited. For example, depositing a semiconductor layer may further include depositing a first semiconductor layer on the semiconductor substrate and depositing at least one second semiconductor layer on the first semiconductor layer.

The adynamic diamond layers of the present invention are not self supporting, and thus may require support from an associated substrate. At least part of the adynamic nature of the diamond layer may be a result of the thickness of the diamond layer. In one aspect, for example, the adynamic diamond layer has a thickness of less than about 30 microns. In another aspect, the adynamic diamond layer has a thickness of from about 5 microns to about 20 microns.

Any type of diamond material may be utilized for making the adynamic diamond layers. In one aspect, however, the adynamic diamond layer may be deposited as a conformal diamond coating having adynamic properties. Such a conformal diamond coating may be deposited by exposing substantially all of a growth surface of the semiconductor layer to chemical vapor deposition conditions without an electrical bias such that a carbon film is formed upon substantially all of the growth surface, and depositing a layer of diamond by a chemical vapor deposition process onto the carbon film to form the adynamic diamond layer.

In another aspect of the present invention, the semiconductor substrate may be removed from the semiconductor layer following the coupling of the support substrate to the adynamic diamond layer. Following such removal, the device may be modified in various ways. For example, in one aspect an additional semiconductor layer may be deposited onto the semiconductor layer opposite to the adynamic diamond layer. In another aspect, at least one interdigital transducer may be deposited on the semiconductor layer.

In yet another aspect of the present invention, at least a portion of the semiconductor substrate may be retained by the semiconductor layer. Accordingly, light generated in the semiconductor layer may be emitted primarily through the semiconductor substrate.

The present invention also provides semiconductor-on-diamond devices having improved thermal properties made according to the methods disclosed herein. Such a device may include an adynamic diamond layer disposed on a support substrate, and a semiconductor layer disposed on the adynamic diamond layer. Various semiconductor-on-diamond devices are contemplated having such a configuration. For example, in one aspect the semiconductor-on-diamond device is a light-emitting diode (LED). In another aspect, the semiconductor-on-diamond device is a laser diode. In yet another aspect, the semiconductor-on-diamond device is an acoustic filter. Though various acoustic filters are contemplated, in one aspect the acoustic filter is a SAW filter.

In yet another aspect of the present invention, an LED device is provided. Such a device may include a sapphire substrate, a semiconductor layer of gallium nitride, aluminum nitride, or a combination of gallium nitride and aluminum nitride coupled to the sapphire substrate, and an adynamic diamond layer coupled to the semiconductor layer opposite the sapphire substrate. Such an LED device is configured such that light generated in the semiconductor layer is emitted primarily through the sapphire substrate. In some aspects, a support substrate may be further coupled to the adynamic layer opposite the semiconductor layer.

There has thus been outlined, rather broadly, various features of the invention so that the detailed description thereof that follows may be better understood, and so that the present contribution to the art may be better appreciated. Other features of the present invention will become clearer from the following detailed description of the invention, taken with the accompanying claims, or may be learned by the practice of the invention.

DETAILED DESCRIPTION OF THE INVENTION

Definitions

Figure 1:
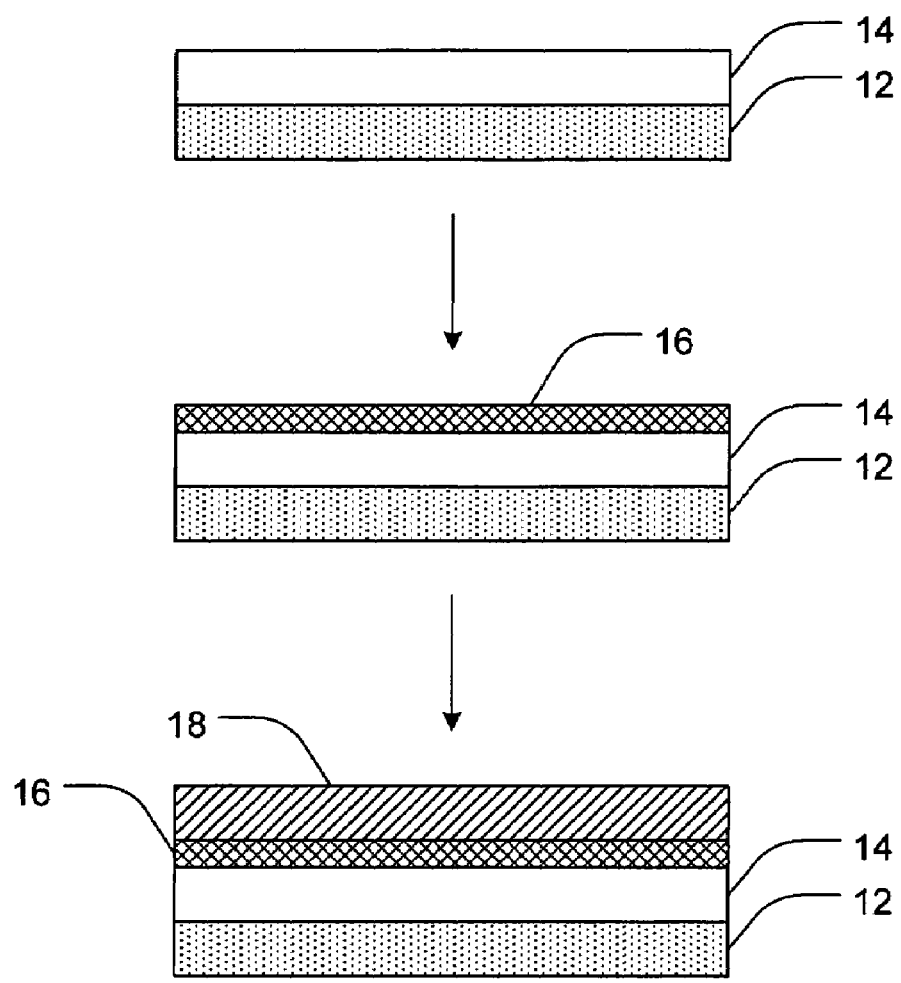
FIG. 1 is a cross-section view of a semiconductor device being constructed in accordance with one embodiment of the present invention.

In describing and claiming the present invention, the following terminology will be used in accordance with the definitions set forth below.

The singular forms "a," "an," and, "the" include plural referents unless the context clearly dictates otherwise. Thus, for example, reference to "a heat source" includes reference to one or more of such sources, and reference to "the diamond layer" includes reference to one or more of such layers.

The terms "heat transfer," "heat movement," and "heat transmission" can be used interchangeably, and refer to the movement of heat from an area of higher temperature to an area of cooler temperature. It is intended that the movement of heat include any mechanism of heat transmission known to one skilled in the art, such as, without limitation, conductive, convective, radiative, etc.

As used herein, the term "emitting" refers to the process of moving heat or light from a solid material into the air.

As used herein, "light-emitting surface" refers to a surface of a device or object from which light is intentionally emitted. Light may include visible light and light within the ultraviolet spectrum. An example of a light-emitting surface may include, without limitation, a nitride layer of an LED, or of semiconductor layers to be incorporated into an LED, from which light is emitted.

As used herein, "vapor deposited" refers to materials which are formed using vapor deposition techniques. "Vapor deposition" refers to a process of depositing materials on a substrate through the vapor phase. Vapor deposition processes can include any process such as, but not limited to, chemical vapor deposition (CVD) and physical vapor deposition (PVD). A wide variety of variations of each vapor deposition method can be performed by those skilled in the art. Examples of vapor deposition methods include hot filament CVD, rf-CVD, laser CVD (LCVD), laser ablation, conformal diamond coating processes, metal-organic CVD (MOCVD), sputtering, thermal evaporation PVD, ionized metal PVD (IMPVD), electron beam PVD (EBPVD), reactive PVD, and the like.

As used herein, "chemical vapor deposition," or "CVD" refers to any method of chemically depositing diamond particles in a vapor form upon a surface. Various CVD techniques are well known in the art.

As used herein, "physical vapor deposition," or "PVD" refers to any method of physically depositing diamond particles in a vapor form upon a surface. Various PVD techniques are well known in the art.

As used herein, "diamond" refers to a crystalline structure of carbon atoms bonded to other carbon atoms in a lattice of tetrahedral coordination known as $sp^3$ bonding. Specifically, each carbon atom is surrounded by and bonded to four other carbon atoms, each located on the tip of a regular tetrahedron. Further, the bond length between any two carbon atoms is 1.54 angstroms at ambient temperature conditions, and the angle between any two bonds is 109 degrees, 28 minutes, and 16 seconds although experimental results may vary slightly. The structure and nature of diamond, including its physical and electrical properties are well known in the art.

As used herein, "distorted tetrahedral coordination" refers to a tetrahedral bonding configuration of carbon atoms that is irregular, or has deviated from the normal tetrahedron configuration of diamond as described above. Such distortion generally results in lengthening of some bonds and shortening of others, as well as the variation of the bond angles between the bonds. Additionally, the distortion of the tetrahedron alters the characteristics and properties of the carbon to effectively lie between the characteristics of carbon bonded in $sp^3$ configuration (i.e. diamond) and carbon bonded in $sp^2$ configuration (i.e. graphite). One example of material having carbon atoms bonded in distorted tetrahedral bonding is amorphous diamond.

As used herein, "diamond-like carbon" refers to a carbonaceous material having carbon atoms as the majority element, with a substantial amount of such carbon atoms bonded in distorted tetrahedral coordination. Diamond-like carbon (DLC) can typically be formed by PVD processes, although CVD or other processes could be used such as vapor deposition processes. Notably, a variety of other elements can be included in the DLC material as either impurities, or as dopants, including without limitation, hydrogen, sulfur, phosphorous, boron, nitrogen, silicon, tungsten, etc.

As used herein, "amorphous diamond" refers to a type of diamond-like carbon having carbon atoms as the majority element, with a substantial amount of such carbon atoms bonded in distorted tetrahedral coordination. In one aspect, the amount of carbon in the amorphous diamond can be at least about 90%, with at least about 20% of such carbon being bonded in distorted tetrahedral coordination. Amorphous diamond also has a higher atomic density than that of diamond (176 atoms/cm$^3$). Further, amorphous diamond and diamond materials contract upon melting.

As used herein, "adynamic" refers to a type of layer which is unable to independently retain its shape and/or strength. For example, in the absence of a mold or support layer, an adynamic diamond layer will tend to curl or otherwise deform when the mold or support surface is removed. While a number of reasons may contribute to the adynamic properties of a layer, in one aspect, the reason may be the extreme thinness of the layer.

As used herein, "growth side," and "grown surface" may be used interchangeably and refer to the surface of a film or layer which is grows during a CVD process.

As used herein, "interdigital transducers" (IDT) and "electrodes" may be used interchangeably and refer to conductive or semi-conductive contacts which are coupled to a piezoelectric semiconductor layer as known by those skilled in the art in order to create an acoustic filter such as a SAW filter or other electronic device. In one aspect of the present invention, the IDT may be coupled to the piezoelectric semiconductor layer on an outside surface thereof, or on the interface surface thereof.

As used herein, "substrate" refers to a support surface to which various materials can be joined in forming a semiconductor or semiconductor-on-diamond device. The substrate may be any shape, thickness, or material, required in order to achieve a specific result, and includes but is not limited to metals, alloys, ceramics, and mixtures thereof. Further, in some aspects, the substrate may be an existing semiconductor device or wafer, or may be a material which is capable of being joined to a suitable device.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Invention

The present invention provides semiconductor devices having incorporated diamond layers and methods of making such devices. Semiconductor devices are often challenging to cool, particularly those that emit light. Much of the heat generated by such devices may be associated with the surface that emits the light. For example, an LED may consist of a plurality of nitride layers arranged to emit light from a light-emitting surface. Because heat sinks cannot interfere with the function of the nitride layers or the light-emitting surface, they are often located at the junction between the LED and a supporting structure such as a circuit board. Such a heat sink location is relatively remote from the accumulation of much of the heat, namely, the light-emitting surface and the nitride layers. Additionally, in both semiconductor devices that emit light and those that don't, heat may be trapped within the semiconducting layers due to the relatively poor thermal conductivity of materials that often make up these layers. The inventor has developed semiconductor devices incorporating thin adynamic layers of diamond that provide, among other things, improved cooling properties to the device. Such a thin adynamic layer of diamond increases the flow of heat laterally through the semiconductor device to thus reduce the amount of heat trapped within the semiconductor layers. This lateral heat transmission may thus effectively improve the thermal properties of many semiconductor devices. Additionally, it should be noted that the beneficial properties provided by the adynamic diamond layer may extend beyond cooling, and as such, the present scope should not be limited thereto.

Accordingly, in one aspect of the present invention, a method of making a semiconductor-on-diamond device is provided. Such a method may include depositing a semiconductor layer on a semiconductor substrate, depositing an adynamic diamond layer on the semiconductor layer opposite the semiconductor substrate, and coupling a support substrate to the adynamic diamond layer opposite the semiconductor layer to support the adynamic layer. Any type of semiconductor device known to generate heat would be considered to be within the scope of the present invention. Specific examples may include, without limitation, LEDs, laser diodes, acoustic filters such as surface acoustic wave (SAW) and bulk acoustic wave (BAW) filters, integrated circuit (IC) chips, etc.

Diamond materials have excellent thermal conductivity properties that make them ideal for incorporation into semiconductor devices. The transfer of heat that is present in the semiconductor device can thus be accelerated from the device through an adynamic diamond layer. It should be noted that the present invention is not limited as to specific theories of heat transmission. As such, in one aspect the accelerated movement of heat from inside the device can be at least partially due to heat movement into and through the adynamic diamond layer. Due to the heat conductive properties of diamond, heat can rapidly spread laterally through the diamond layer and to the edges of the semiconductor device. Heat present around the edges will be more rapidly dissipated into the air or into surrounding structures, such as heat spreaders or device supports. Because the thermal conductivity of diamond is greater that the thermal conductivity of the semiconductor layer, a heat sink is established by the adynamic diamond layer beneath the semiconductor layer. As such, heat that builds up in the semiconductor layer is drawn into the adynamic diamond layer and spread laterally to be discharged from the device. Such accelerated heat transfer may result in semiconductor devices with much cooler operational temperatures. Additionally, the acceleration of heat transfer away from a light-emitting surface not only cools the semiconductor device, but may also reduce the heat load on many electronic components that are spatially located near the semiconductor device.

In some aspects of the present invention, the edges of the adynamic diamond layer may be exposed to the air. In such aspects, the accelerated movement of heat away from the semiconductor layer may be at least partially due to heat movement from the diamond layer to air. For example, a diamond material such as diamond-like carbon (DLC) has exceptional heat emissivity characteristics even at temperatures below 100° C., and as such, may effectively radiate heat directly to the air. As has been discussed, many semiconductor materials that comprise the device may conduct heat much better than they emit heat. As such, heat can be conducted through the semiconductor layer to the adynamic DLC layer, spread laterally through the adynamic DLC layer, and subsequently emitted to the air along the edges. Due to the high heat conductive and radiative properties of DLC, heat movement from the DLC layer to air can be greater than heat movement from the semiconductor layer to air. Also, heat movement from the semiconductor device to the adynamic DLC layer can be greater than heat movement from the semiconductor device to the air. As such, the layer of DLC can serve to accelerate heat transfer away from the semiconductor layer more rapidly than heat can be transferred through the semiconductor device itself, or from the semiconductor device to the air.

As has been suggested, various diamond materials may be utilized to provide accelerated heat transferring properties to a semiconductor device. Non-limiting examples of such diamond materials may include diamond, DLC, amorphous diamond, and combinations thereof. It should be noted, however, that any form of natural or synthetic diamond material that may be utilized to cool a semiconductor device is considered to be within the present scope.

Generally, diamond layers may be formed by any means known, including various vapor deposition techniques. Any number of known vapor deposition techniques may be used to form these diamond layers. The most common vapor deposition techniques include CVD and PVD, although any similar method can be used if similar properties and results are obtained. In one aspect, CVD techniques such as hot filament, microwave plasma, oxyacetylene flame, rf-CVD, laser CVD (LCVD), metal-organic CVD (MOCVD), laser ablation, conformal diamond coating processes, and direct current arc techniques may be utilized. Typical CVD techniques use gas reactants to deposit the diamond or diamond-like material in a layer, or film. These gases generally include a small amount (i.e. less than about 5%) of a carbonaceous material, such as methane, diluted in hydrogen. A variety of specific CVD processes, including equipment and conditions, as well as those used for boron nitride layers, are well known to those skilled in the art. In another aspect, PVD techniques such as sputtering, cathodic arc, and thermal evaporation may be utilized. Further, specific deposition conditions may be used in order to adjust the exact type of material to be deposited, whether DLC, amorphous diamond, or pure diamond. It should also be noted that many semiconductor devices such as LEDs may be degraded by high temperature. Care man need to be taken to avoid damage during diamond deposition by depositing at lower temperatures. For example, if the semiconductor contains InN, deposition temperatures of up to about 600° C. may be used. In the case of GaN, layers may be thermally stable up to about 1000° C. Additionally, preformed layers can be brazed, glued, or otherwise affixed to the semiconductor layer or to the support substrate of the semiconductor device using methods which do not unduly interfere with the heat transference of the diamond layer or the functionality of the device.

An optional nucleation enhancing layer can be formed on the growth surface of the semiconductor layer in order to improve the quality and deposition time of the adynamic diamond layer. Specifically, the adynamic diamond layer can be formed by depositing applicable nuclei, such as diamond nuclei, on the diamond growth surface of the semiconductor layer and then growing the nuclei into a film or layer using a vapor deposition technique. In one aspect of the present invention, a thin nucleation enhancer layer can be coated upon the semiconductor layer to enhance the growth of the diamond layer. Diamond nuclei are then placed upon the nucleation enhancer layer, and the growth of the adynamic diamond layer proceeds via CVD.

A variety of suitable materials will be recognized by those in skilled in the art which can serve as a nucleation enhancer. In one aspect of the present invention, the nucleation enhancer may be a material selected from the group consisting of metals, metal alloys, metal compounds, carbides, carbide formers, and mixtures thereof. Examples of carbide forming materials may include, without limitation, tungsten (W), tantalum (Ta), titanium (Ti), zirconium (Zr), chromium (Cr), molybdenum (Mo), silicon (Si), and manganese (Mn). Additionally, examples of carbides include tungsten carbide (WC), silicon carbide (SiC), titanium carbide (TiC), zirconium carbide (ZrC), and mixtures thereof among others.

The nucleation enhancer layer, when used, is a layer which is thin enough that it does not to adversely affect the thermal transmission properties of the adynamic diamond layer. In one aspect, the thickness of the nucleation enhancer layer may be less than about 0.1 micrometers. In another aspect, the thickness may be less than about 10 nanometers. In yet another aspect, the thickness of the nucleation enhancer layer is less than about 5 nanometers. In a further aspect of the invention, the thickness of the nucleation enhancer layer is less than about 3 nanometers.

Various methods may be employed to increase the quality of the diamond in the nucleation surface of the diamond layer which is created by vapor deposition techniques. For example, diamond particle quality can be increased by reducing the methane flow rate, and increasing the total gas pressure during the early phase of diamond deposition. Such measures, decrease the decomposition rate of carbon, and increase the concentration of hydrogen atoms. Thus a significantly higher percentage of the carbon will be deposited in a $sp^3$ bonding configuration, and the quality of the diamond nuclei formed is increased. Additionally, the nucleation rate of diamond particles deposited on the growth surface of the semiconductor layer or the nucleation enhancer layer may be increased in order to reduce the amount of interstitial space between diamond particles. Examples of ways to increase nucleation rates include, but are not limited to; applying a negative bias in an appropriate amount, often about 100 volts, to the growth surface; polishing the growth surface with a fine diamond paste or powder, which may partially remain on the growth surface; and controlling the composition of the growth surface such as by ion implantation of C, Si, Cr, Mn, Ti, V, Zr, W, Mo, Ta, and the like by PVD or PECVD. PVD processes are typically at lower temperatures than CVD processes and in some cases can be below about 200° C. such as about 150° C. Other methods of increasing diamond nucleation will be readily apparent to those skilled in the art.

In one aspect of the present invention, the diamond layer may also be a conformal diamond layer. Conformal diamond coating processes can provide a number of advantages over conventional diamond film processes. Conformal diamond coating can be performed on a wide variety of substrates, including non-planar substrates. A growth surface can be pretreated under diamond growth conditions in the absence of a bias to form a carbon film. The diamond growth conditions can be conditions that are conventional CVD deposition conditions for diamond without an applied bias. As a result, a thin carbon film can be formed which is typically less than about 100 angstroms. The pretreatment step can be performed at almost any growth temperature such as from about 200° C. to about 900° C., although lower temperatures below about 500° C. may be preferred. Without being bound to any particular theory, the thin carbon film appears to form within a short time, e.g., less than one hour, and is a hydrogen terminated amorphous carbon.

Following formation of the thin carbon film, the growth surface may then be subjected to diamond growth conditions to form the adynamic diamond layer as an adynamic conformal diamond layer. The diamond growth conditions may be those conditions which are commonly used in traditional CVD diamond growth. However, unlike conventional diamond film growth, the diamond film produced using the above pretreatment steps results in a conformal diamond film that typically begins growth substantially over the entire growth surface with substantially no incubation time. In addition, a continuous film, e.g. substantially no grain boundaries, can develop within about 80 nm of growth. Adynamic diamond layers having substantially no grain boundaries may move heat more efficiently than those layers having grain boundaries.

The adynamic diamond layer may be of any thickness that would allow cooling according to the methods and devices of the present invention. Thicknesses may vary depending on the application and the semiconductor device configuration. For example, greater cooling requirements may require a slightly thicker adynamic diamond layer. The thickness may also vary depending on the material used in the diamond layer. That being said, in one aspect an adynamic diamond layer may be less than about 30 microns. In another example, an adynamic diamond layer may be from about 5 microns to about 20 microns.

FIG. 1 shows selected steps of constructing a semiconductor-on-diamond device according to particular aspects of the present invention. A semiconductor substrate 12 is provided upon which further layers of the semiconductor device are deposited. The semiconductor substrate 12 may be made from a semiconducting material or a non-semiconducting material, depending on the intended use of the device. Non-limiting examples of semiconducting materials that may be used include silicon, silicon carbide, silicon germanium, sapphire, aluminum arsenide, aluminum phosphide, gallium arsenide, gallium phosphide, gallium nitride, and combinations thereof. In one specific aspect, the semiconductor substrate may be silicon. In another aspect, the semiconductor substrate may be sapphire. Non-limiting examples of non-semiconducting materials may include glass, metals, ceramics, graphite, and combinations thereof.

A semiconductor layer 14 may be deposited on the semiconductor substrate 12 using a variety of techniques known to those of ordinary skill in the art. One example of such a technique is MOCVD processes. The semiconductor layer 14 may comprise any material that is suitable for forming electronic devices, semiconductor devices, or the like. Many semiconductors are based on silicon, gallium, indium, and germanium. However, suitable materials for the semiconductor layer can include, without limitation, silicon, silicon carbide, silicon germanium, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, and composites thereof. In one aspect, however, the semiconductor layer can comprise silicon, silicon carbide, gallium arsenide, gallium nitride, gallium phosphide, aluminum nitride, indium nitride, indium gallium nitride, aluminum gallium nitride, or composites of these materials. In some additional embodiments, non-silicon based devices can be formed such as those based on gallium arsenide, gallium nitride, germanium, boron nitride, aluminum nitride, indium-based materials, and composites thereof. In another embodiment, the semiconductor layer can comprise gallium nitride, indium gallium nitride, indium nitride, and combinations thereof. In one specific aspect, the semiconductor material is gallium nitride. In another specific aspect, the semiconductor material is aluminum nitride. Other semiconductor materials which can be used include $Al_2O_3$, BeO, W, Mo, c-$Y_2O_3$, c-$(Y_{0.9}La_{0.1})_2O_3$, c-$Al_{23}O_{27}N_5$, c-$MgAl_2O_4$, t-$MgF_2$, graphite, and mixtures thereof. It should be understood that the semiconductor layer may include any semiconductor material known, and should not be limited to those materials described herein. Additionally, semiconductor materials may be of any structural configuration known, for example, without limitation, cubic (zincblende or sphalerite), wurtzitic, rhombohedral, graphitic, turbostratic, pyrolytic, hexagonal, amorphous, or combinations thereof. As has been described, the semiconductor layer 14 may be deposited by any method known to one of ordinary skill in the art. Various known methods of vapor deposition can be utilized to deposit such layers and that allow deposition to occur in a graded manner.

In one aspect of the present invention, the semiconductor layer 14 may be gallium nitride (GaN). GaN semiconductor layers may be useful in constructing LEDs and other semiconductor devices. In some cases it may be beneficial to gradually transition between the semiconductor substrate 12 and the semiconductor layer 14. For example, gradually transitioning an indium nitride (InN) semiconductor substrate into a GaN semiconductor layer may occur by fixing the concentration of the N being vapor deposited and varying the deposited concentration of Ga and of In such that a ratio of Ga:In gradually transitions from about 0:1 to about 1:0. In other words, the sources of Ga and In are varied such that as the In concentration is decreased, the Ga concentration is increased. The gradual transition functions to greatly reduce the lattice mismatch observed when depositing GaN directly on InN.

In another aspect, the semiconductor layer 14 may be a layer of aluminum nitride (AlN). The AlN layer may be deposited onto the semiconductor substrate 12 by any means known to one of ordinary skill in the art. As with the GaN layer described above, gradually transitioning between semiconductor layers may improve the functionality of the semiconductor device. For example, in one aspect AlN may be deposited onto a semiconductor substrate of InN by gradually transitioning the layer of InN into the layer of AlN. Such a gradual transition may include, for example, gradually transitioning the layer of InN into the layer of AlN by fixing the concentration of N being deposited and varying the deposited concentration of In and of Al such that a ratio of In:Al gradually transitions from about 0:1 to about 1:0. Such a gradual transition may greatly reduce the lattice mismatch observed when depositing AlN on InN directly. Surface processing may be performed between any of the deposition steps described in order to provide a smooth surface for subsequent deposition. Such processing may be accomplished by any means known, such as by chemical etching, polishing, buffing, grinding, etc.

Returning to FIG. 1, an adynamic diamond layer 16 may be deposited on the semiconductor layer 14. A description of the adynamic diamond layer and the creation thereof are discussed further herein. A support substrate 18 can then be deposited on the adynamic diamond layer 16 in order to support the adynamic diamond layer. The support substrate 18 can be any material that provides support to the adynamic diamond layer 16. Non-limiting examples of materials that may be used as support substrates may include metals, glass, polymeric materials, resins, ceramics, etc. and combinations thereof. The support substrate 18 may be coupled to the adynamic diamond layer 16 by any known method. Examples of methods of coupling may include, without limitation, vapor deposition, adhesives, brazing, etc. In one aspect, for example, the support substrate 18 may be vapor deposited onto the adynamic diamond layer 16 by vapor deposition means. In another aspect, the diamond layer 16 may be formed on the support substrate 18 and subsequently glued or brazed to the semiconductor layer 14.

Figure 2:
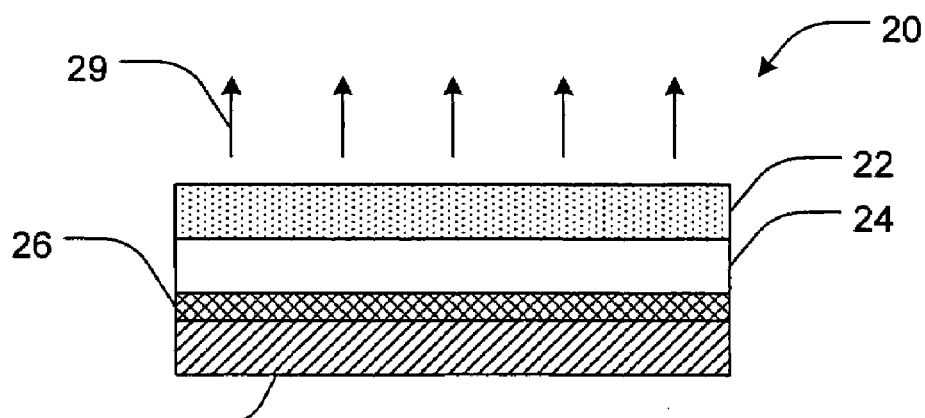
FIG. 2 is a cross-section view of a semiconductor device in accordance with one embodiment of the present invention.

As has been described, various semiconductor devices are contemplated. For example, FIG. 2 shows a specific aspect of the present invention whereby the semiconductor device is an LED device 20. In one example of such a device, the semiconductor substrate may be a sapphire substrate 22 having a semiconductor layer 24 deposited thereon, where the semiconductor layer is GaN, AlN, or a combination thereof. An adynamic diamond layer 26 is deposited on the semiconductor layer 24, and a support substrate 28 is deposited on the adynamic diamond layer 26 to provide support and manipulation convenience. Such a configuration allows the direction of the LED to be reversed as compared to present LEDs, such that light generated in the semiconductor layer 24 can be emitted primarily through the sapphire substrate 22 as shown at 29. Light emission from such a configuration may be facilitated by applying a reflector layer to the adynamic diamond layer prior to application of the support substrate (not shown). Such a layer would allow light emitted toward the support substrate to be reflected back towards the sapphire substrate and from the device. Numerous materials may be utilized to create a reflective layer, all of which should be considered to be within the present scope. In one example, however, a chromium layer can be sputtered onto the adynamic diamond material to form such a reflective layer.

Figure 3:
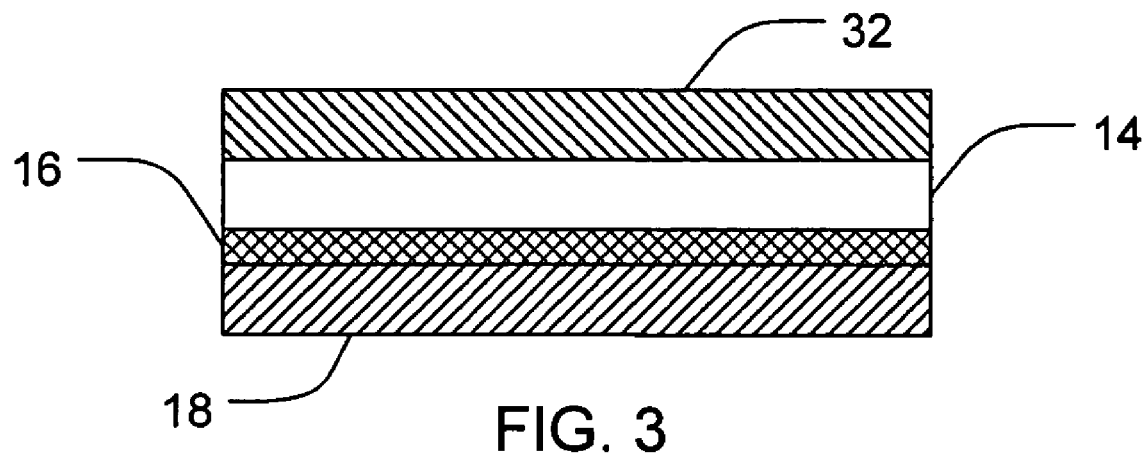
FIG. 3 is a cross-section view of a semiconductor device in accordance with one embodiment of the present invention.

FIG. 3 shows a semiconductor device constructed as shown in FIG. 1, but having the semiconductor substrate (not shown) removed from the semiconductor layer 14. In this aspect, an additional semiconductor layer 32 may be deposited onto the semiconductor layer 14. The additional semiconductor layer 32 may be constructed of any semiconductor material known, and may be deposited by any known method, as has been described herein. Additionally, in one aspect, the additional semiconductor layer 32 may be a plurality of additional semiconductor layers. In one particular aspect of the present invention the semiconductor and/or the additional semiconductor layer can be nitride layers for use as LED devices.

As they have become increasingly important in electronics and lighting devices, LEDs continue to be developed that have ever increasing power requirements. This trend of increasing power has created cooling problems for these devices. These cooling problems can be exacerbated by the typically small size of these devices, which may render heat sinks with traditional aluminum heat fins ineffective due to their bulky nature. Additionally, such traditional heat sinks would block the emission of light if applied to the light-emitting surface of the LED. The inventor has discovered that depositing an adynamic diamond layer within the LED package allows adequate cooling even at high power, while maintaining a small LED package size. Additionally, in one aspect the maximum operating wattage of an LED may be exceeded by drawing heat from the semiconductor layers of the LED with an adynamic diamond layer in order to operate the LED at an operating wattage that is higher than the maximum operating wattage for that LED.

Figure 4:
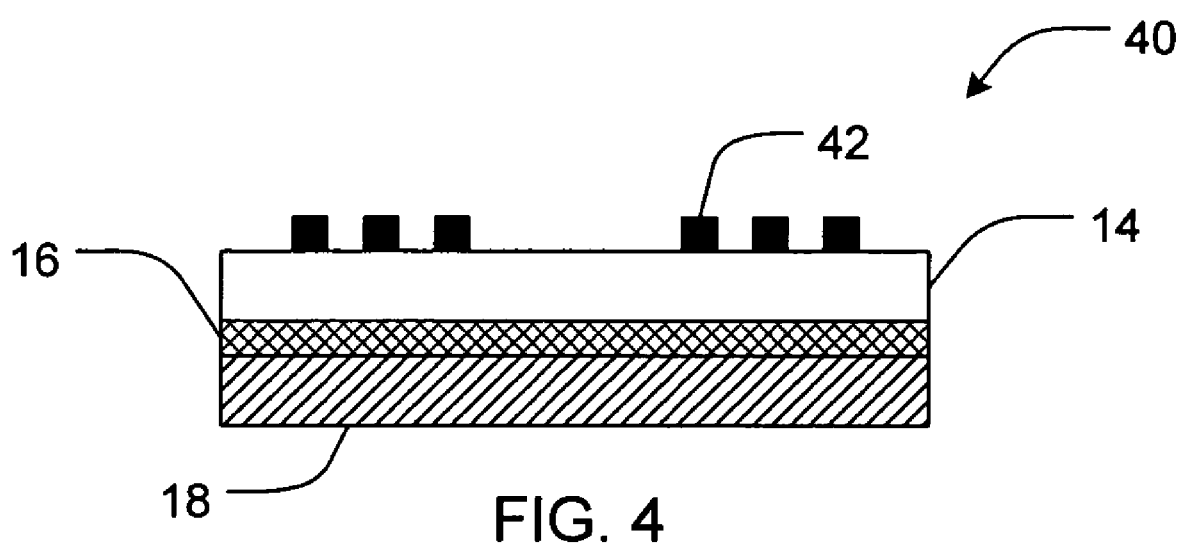
FIG. 4 is a cross-section view of a semiconductor device in accordance with one embodiment of the present invention.

In another aspect, as shown in FIG. 4, a semiconductor device constructed as in FIG. 1 can be used to construct an acoustic filter 40 by first removing the semiconductor substrate (not shown) from the semiconductor layer 14. In the case of SAW filters, the semiconductor layer 14 may be a piezoelectric layer. Interdigital transducers 42 can be coupled to the surface of the piezoelectric semiconductor layer to form the SAW filter.

EXAMPLES

The following examples illustrate various techniques of making a semiconductor device according to aspects of the present invention. However, it is to be understood that the following are only exemplary or illustrative of the application of the principles of the present invention. Numerous modifications and alternative compositions, methods, and systems can be devised by those skilled in the art without departing from the spirit and scope of the present invention. The appended claims are intended to cover such modifications and arrangements. Thus, while the present invention has been described above with particularity, the following Examples provide further detail in connection with several specific embodiments of the invention.

Example 1

A GaN LED crystal is formed on a sapphire substrate. An adynamic diamond film is coated on top of the GaN layer. The adynamic diamond film is deposited by microwave enhanced plasma CVD with methane (1%) and hydrogen (99%) as the gas mixture (100 torr). The adynamic diamond film is then sputter coated with Cr as a reflector and brazed to a silicon support substrate. With such an LED, light generated in the GaN layer is emitted primarily through the sapphire substrate.

Example 2

An adynamic diamond layer is deposited onto a Si wafer as described in Example 1. The adynamic layer is polished to a smooth surface. A thin layer of Si is sputtered onto the adynamic layer. A GaN LED crystal formed on a sapphire substrate is wafer bonded to the thin layer of Si. Light generated in the GaN layer is thus emitted primarily through the sapphire substrate.

Example 3

An adynamic diamond layer is deposited onto a Si wafer as described in Example 1. The adynamic layer is polished to a smooth surface. A thin layer of Si is sputtered onto the adynamic layer. A GaN LED crystal formed on a sapphire substrate is wafer bonded to the thin layer of Si using a gold-tin alloy to form a reflector to more effectively direct light generated in the GaN layer through the sapphire substrate.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A method of making an LED device, comprising:
   depositing a light-generating semiconductor layer on a semiconductor substrate;
   depositing an adynamic diamond layer on the semiconductor layer opposite the semiconductor substrate; and
   coupling a support substrate to the adynamic diamond layer opposite the semiconductor layer to support the adynamic layer, wherein light generated in the semiconductor layer is emitted primarily through the semiconductor substrate.

2. The method of claim 1, wherein the semiconductor substrate includes a member selected from the group consisting of silicon, silicon carbide, silicon germanium, sapphire, aluminum arsenide, aluminum phosphide, gallium arsenide, gallium phosphide, gallium nitride, and combinations thereof.

3. The method of claim 2, wherein the semiconductor substrate includes sapphire.

4. The method of claim 2, wherein the semiconductor substrate includes Si.

5. The method of claim 1, wherein the semiconductor layer includes a member selected from the group consisting of silicon, silicon carbide, silicon germanium, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, and combinations thereof.

6. The method of claim 1, wherein the semiconductor layer is gallium nitride.

7. The method of claim 1, wherein the semiconductor layer is aluminum nitride.

8. The method of claim 1, wherein depositing a semiconductor layer further includes:
   depositing a first semiconductor layer on the semiconductor substrate; and
   depositing at least one second semiconductor layer on the first semiconductor layer.

9. The method of claim 1, wherein depositing the adynamic diamond layer further includes depositing the adynamic diamond layer as conformal diamond coating.

10. The method of claim 9, wherein depositing the adynamic diamond layer as a conformal coating further includes:
    exposing substantially all of a growth surface of the semiconductor layer to chemical vapor deposition conditions without an electrical bias such that a carbon film is formed upon substantially all of the growth surface; and
    depositing a layer of diamond by a chemical vapor deposition process onto the carbon film to form the adynamic diamond layer.

11. The method of claim 1, wherein the adynamic diamond layer is deposited to a thickness of less than about 30 microns.

12. The method of claim 1, wherein the adynamic diamond layer is deposited to a thickness of from about 5 microns to about 20 microns.

* * * * *